US011402686B2

(12) United States Patent
Kaneki et al.

(10) Patent No.: US 11,402,686 B2
(45) Date of Patent: Aug. 2, 2022

(54) DISPLAY DEVICE AND BONDING METHOD

(71) Applicant: Japan Display Inc., Tokyo (JP)

(72) Inventors: Takeshi Kaneki, Tokyo (JP); Ken Hirabayashi, Tokyo (JP); Hiromichi Tanaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/385,143

(22) Filed: Jul. 26, 2021

(65) Prior Publication Data

US 2021/0349348 A1 Nov. 11, 2021

Related U.S. Application Data

(63) Continuation of application No. 15/606,287, filed on May 26, 2017, now abandoned.

(30) Foreign Application Priority Data

Jun. 28, 2016 (JP) ................. 2016-127414

(51) Int. Cl.
G02F 1/13357 (2006.01)
G02F 1/1333 (2006.01)
G02F 1/1335 (2006.01)
H01L 51/00 (2006.01)
H01L 51/52 (2006.01)

(52) U.S. Cl.
CPC .. *G02F 1/133602* (2013.01); *G02F 1/133308* (2013.01); *G02F 1/133528* (2013.01); *H01L 51/0024* (2013.01); *H01L 51/5246* (2013.01); *H01L 51/5256* (2013.01); *G02F 2202/28* (2013.01)

(58) Field of Classification Search
CPC ............. H01L 51/0024; H01L 51/5256; H01L 51/5246; G02F 1/133308; G02F 1/133528; G02F 1/133602; G02F 2202/28
See application file for complete search history.

(56) References Cited

U.S. PATENT DOCUMENTS

2009/0185101 A1 7/2009 Matsuhira et al.
2018/0031929 A1* 2/2018 Huang ............. G02F 1/133308

FOREIGN PATENT DOCUMENTS

CN 101533174 A 9/2009

OTHER PUBLICATIONS

Chinese Office Action dated Oct. 18, 2021 for the corresponding Chinese Patent Application No. 201710478821.X, with Machine English Translation.
Chinese Office Action dated May 6, 2021 for the corresponding Chinese Patent Application No. 201710478821.X, with English machine translation.

* cited by examiner

*Primary Examiner* — Hoan C Nguyen
(74) *Attorney, Agent, or Firm* — Michael Best & Friedrich LLP

(57) ABSTRACT

A display device includes a display panel, a backlight under the display panel, and an adhesive placed so as to extend over a side face of the display panel and a side face of the backlight. An outer face of the adhesive opposite to a face of the adhesive bonded to the side face of the display panel and the side face of the backlight is formed as a flat face along one or both of the side face of the display panel and the side face of the backlight.

15 Claims, 11 Drawing Sheets

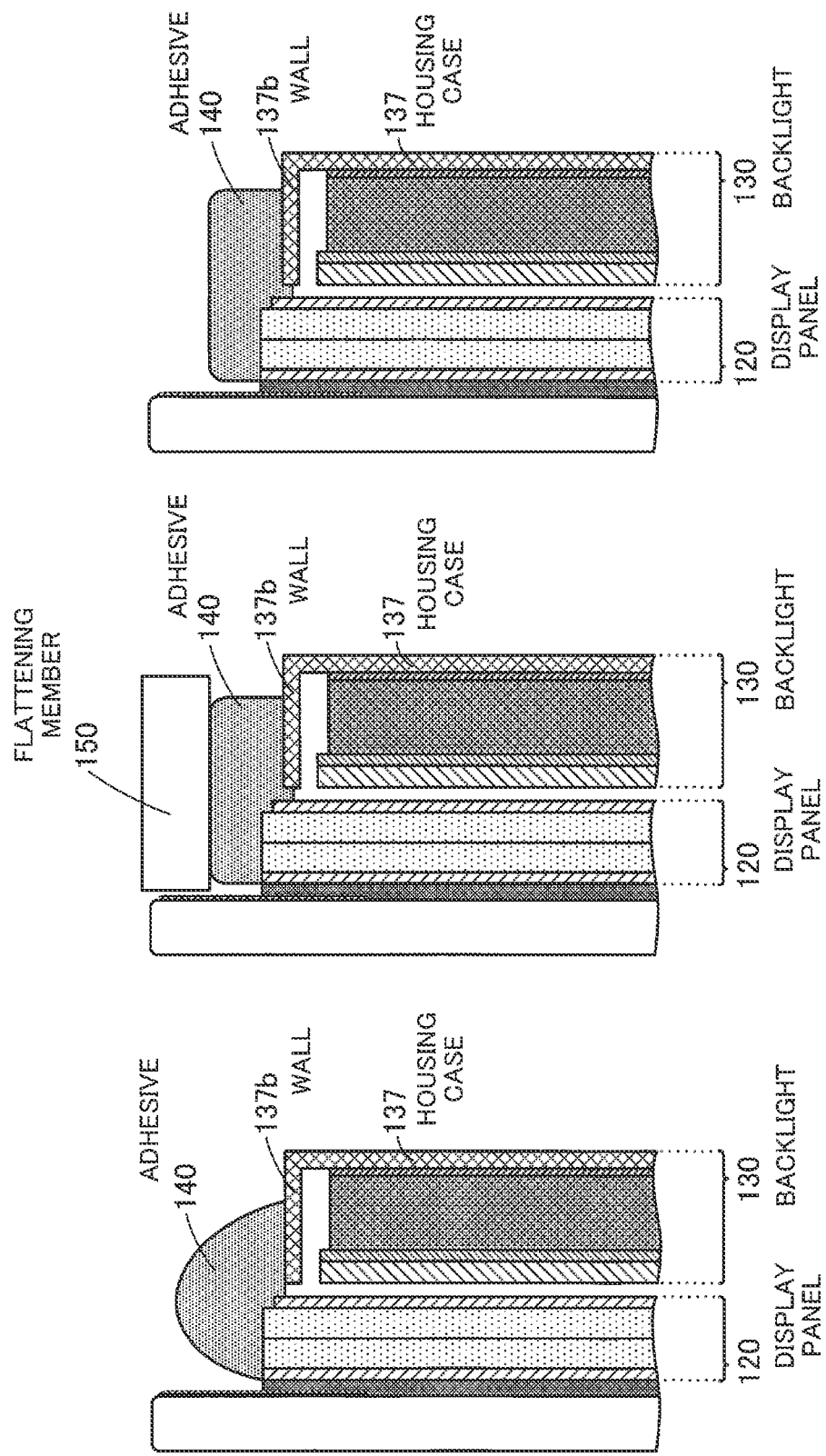

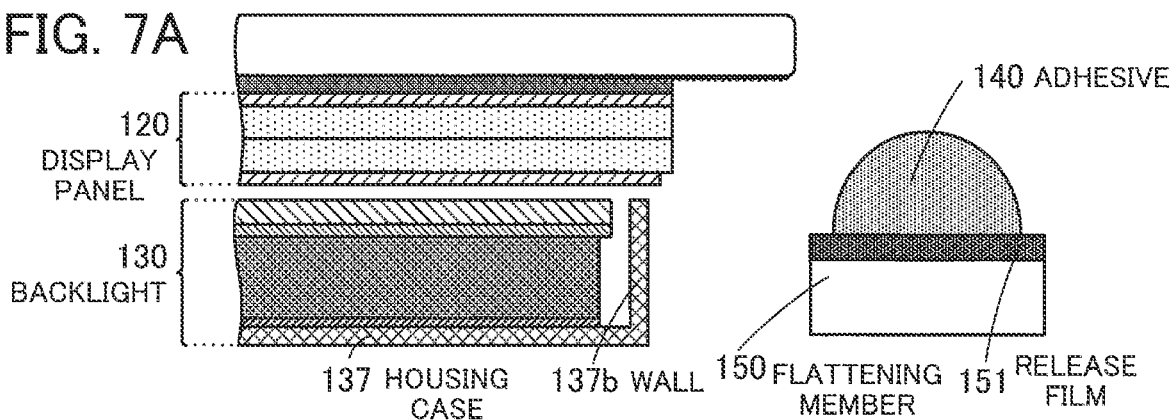
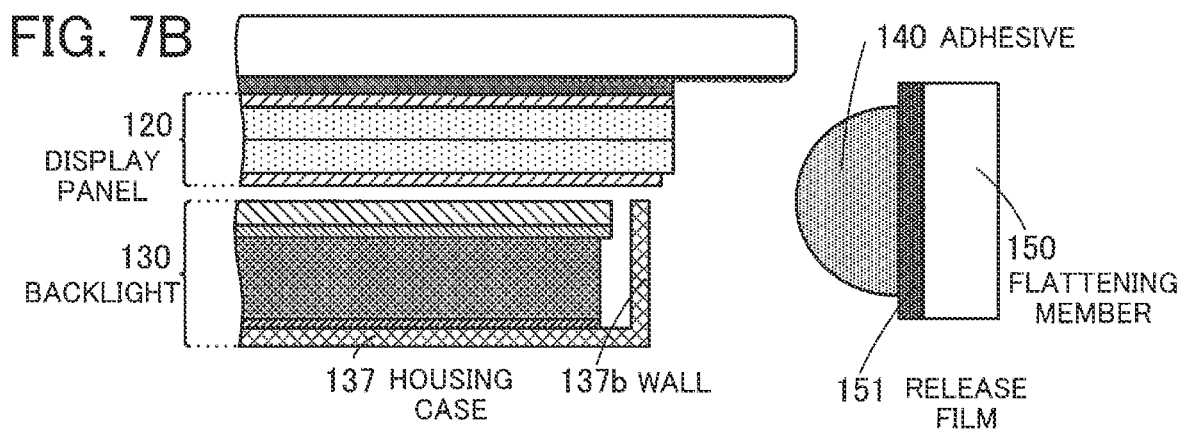
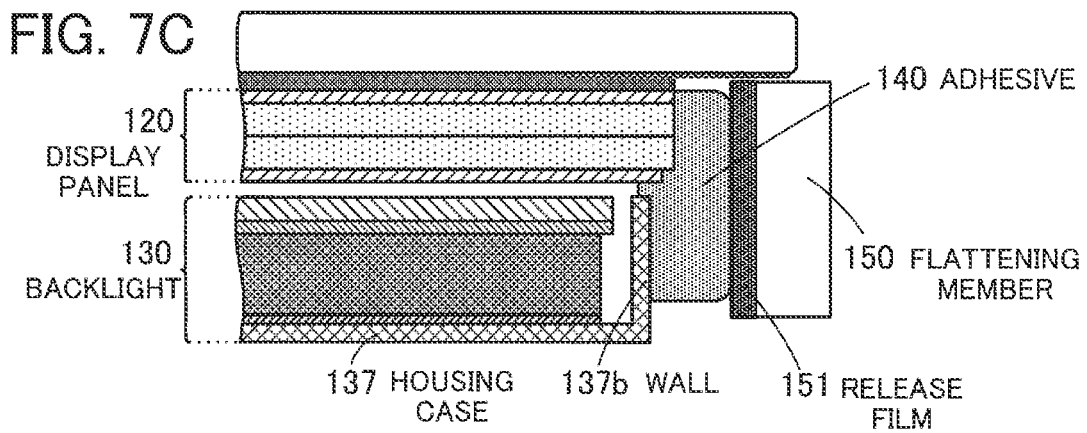
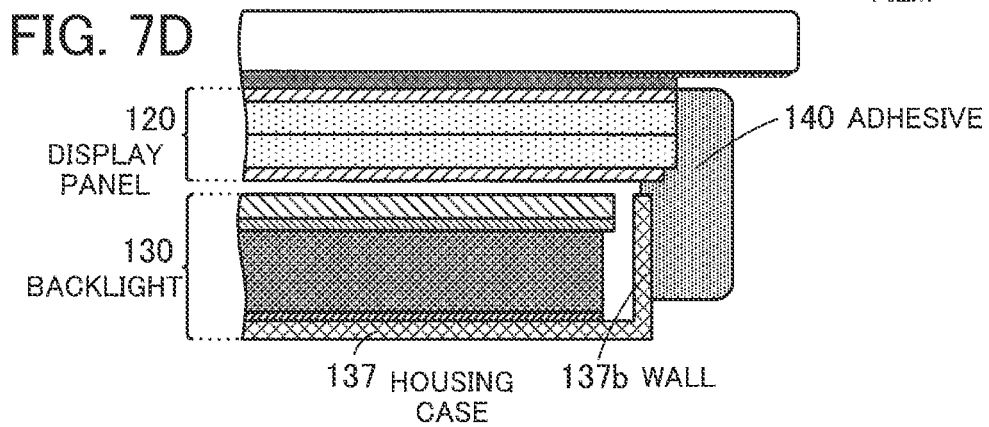

US 11,402,686 B2

DISPLAY DEVICE AND BONDING METHOD

CROSS-REFERENCE TO RELATED APPLICATIONS

This application is a continuation of U.S. patent application Ser. No. 15/606,287 filed on May 26, 2017. Further, this application is based upon and claims the benefit of priority of the prior Japanese Patent Application No. 2016-127414, filed on Jun. 28, 2016, the entire contents of which are incorporated herein by reference.

FIELD

The embodiments discussed herein are related to a display device and a bonding method.

BACKGROUND

In recent years display devices have widely been used in smartphones, personal assistant devices (PADs), tablet computers, car navigation systems, and the like. With these display devices there is a demand for the largest possible display area even in enclosures of the same size and high definition. A reduction in the width of a portion from an outer edge to a display area on which an image is not displayed, that is to say, what is called a narrow frame is needed.

See, for example, U.S. Patent Application Publication No. 2015/0241731.

SUMMARY

According to an aspect, there is provided a display device including a display panel, a backlight under the display panel, and an adhesive placed so as to extend over a side face of the display panel and a side face of the backlight, an outer face of the adhesive opposite to a face of the adhesive bonded to the side face of the display panel and the side face of the backlight being formed as a flat face along one or both of the side face of the display panel and the side face of the backlight.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 6A through 6C illustrate an example of a bonding procedure in the first embodiment based on the method of direct application of an adhesive;

FIGS. 7A through 7D illustrate an example of a bonding procedure in the first embodiment based on an adhesive transfer method;

DESCRIPTION OF EMBODIMENTS

Figure 1:
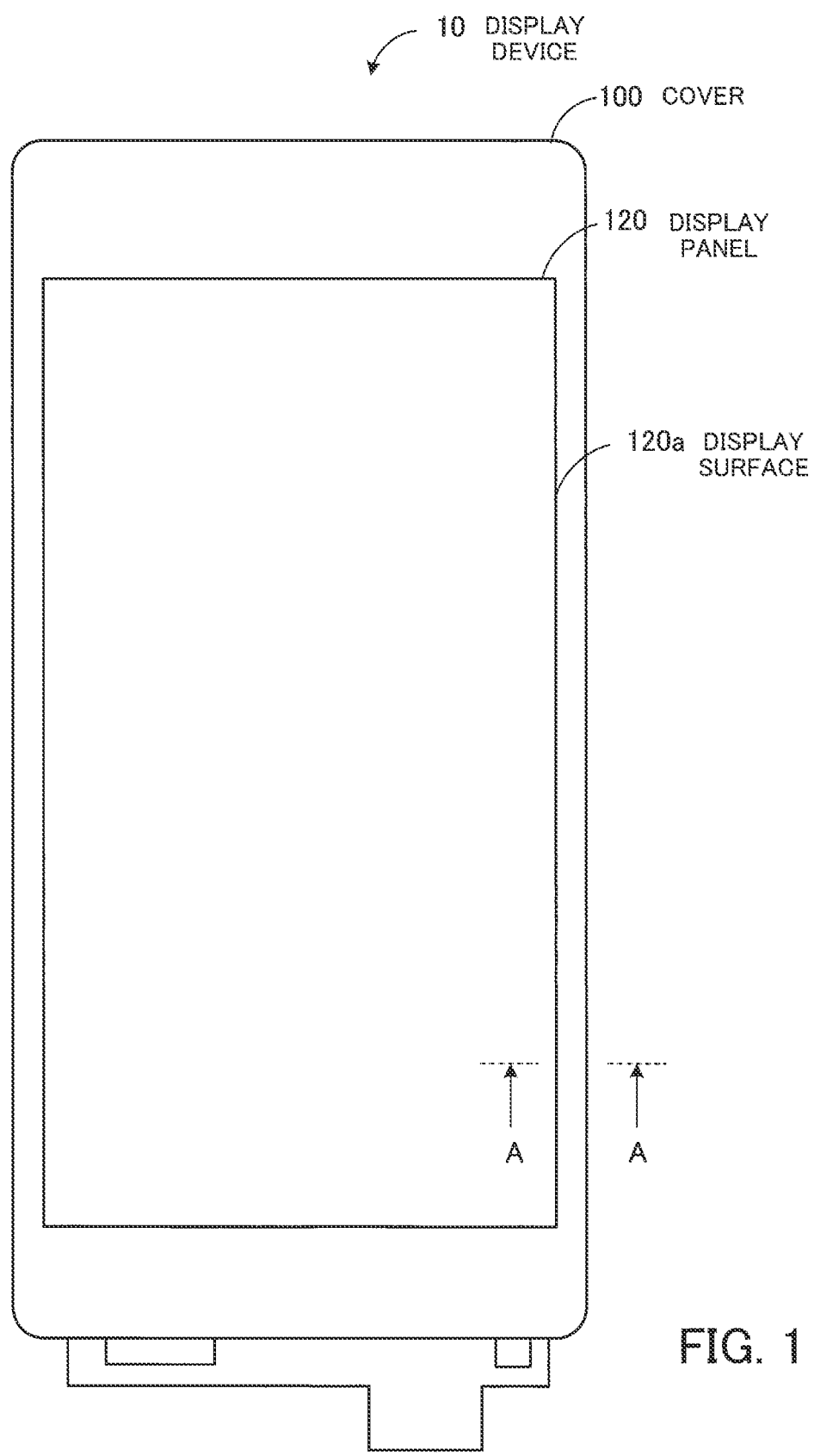
FIG. 1 is a plan view of a display device according to a first embodiment.

Embodiments will now be described with reference to the accompanying drawings.

Disclosed embodiments are simple examples. It is a matter of course that a proper change which suits the spirit of the invention and which will readily occur to those skilled in the art falls within the scope of the present invention. Furthermore, in order to make description clearer, the width, thickness, shape, or the like of each component may schematically be illustrated in the drawings compared with the real state. However, it is a simple example and the interpretation of the present invention is not restricted.

In addition, in the present invention and the drawings the same components that have already been described in previous drawings are marked with the same numerals and detailed descriptions of them may be omitted according to circumstances.

First Embodiment

Figure 2:
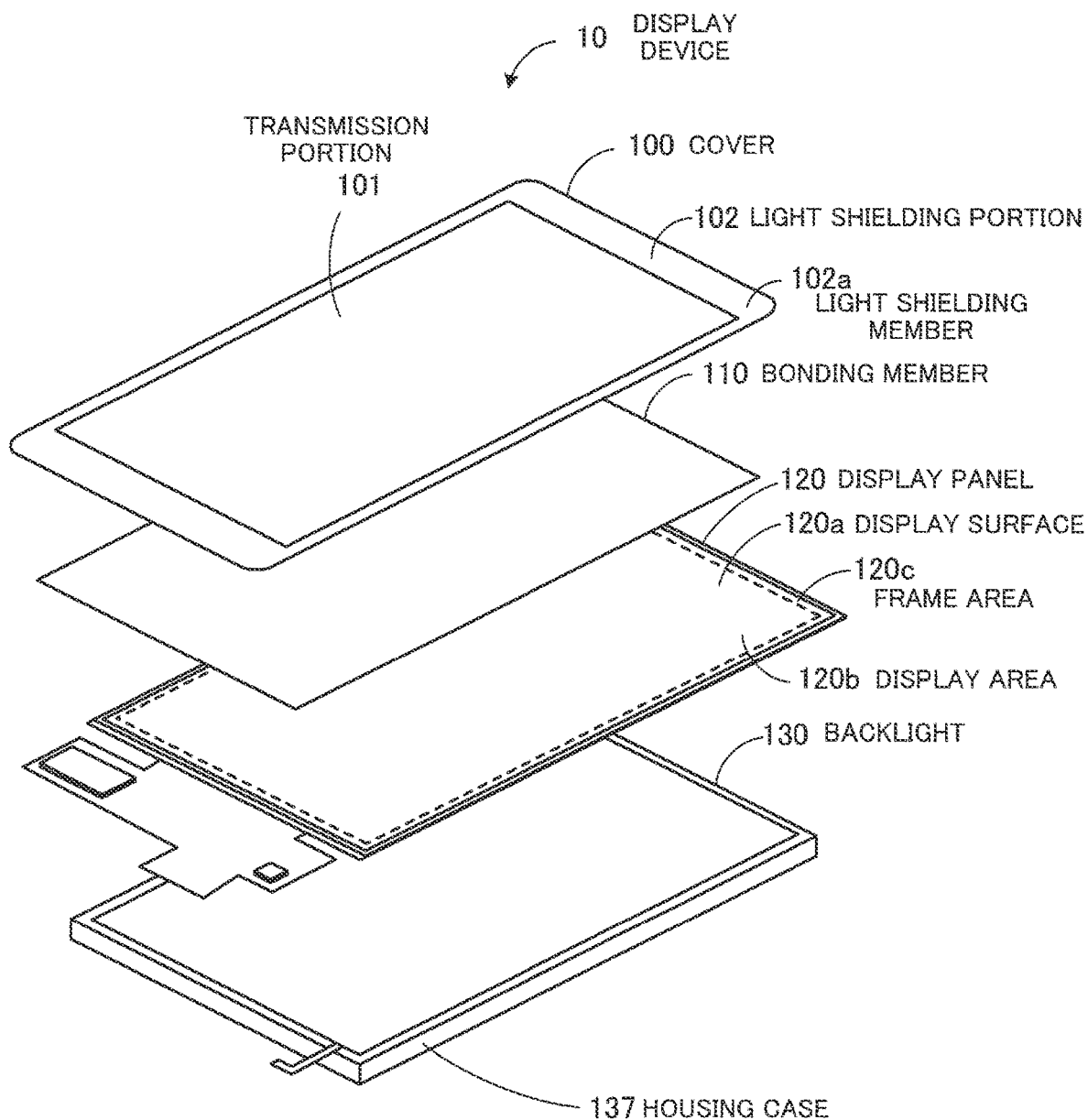
FIG. 2 is an exploded perspective view of the display device according to the first embodiment.

First a display device according to a first embodiment will be described by the use of FIGS. 1 and 2. FIG. 1 is a plan view of a display device according to a first embodiment. FIG. 1 is a plan view of a display device viewed from the side of the front face (face on which an image is displayed). FIG. 2 is an exploded perspective view of the display device according to the first embodiment. In the following description of each component, it is assumed that a face on a side (upper side in FIG. 2) of the display device on which an image is displayed is a front face and that a face (lower side in FIG. 2) opposite to the front face is a back face.

As illustrated in FIG. 2, a display device 10 is a transmission type display device and includes a cover 100, a bonding member 110, a display panel 120, and a backlight 130.

The cover 100 has a rectangular shape whose four corners are rounded and covers a display surface 120a, which is a front face of the display panel 120, to protect the display surface 120a. Furthermore, the size of the cover 100 formed is such that the peripheral edge (outer edge) of the cover 100 extrudes outward from the peripheral edge of the display panel 120 in planar view.

The cover 100 is formed by the use of a glass plate or a transparent resin and includes a transmission portion 101 and a frame-shaped light shielding portion 102 by which the perimeter of the transmission portion 101 is enclosed. The transmission portion 101 is an area which transmits a light, and is opposed to a display area 120b of the display panel 120. The light shielding portion 102 is a light shielding area formed by locating a light shielding member 102a which shields a light on the back face side of the glass plate. The light shielding portion 102 is also referred to as a frame area of the display device 10. The light shielding member 102a may be disposed on the front face side of the glass plate.

The bonding member 110 bonds the cover 100 and the display surface 120a of the display panel 120 together. The bonding member 110 has great transparency and an adhesive property (adhesion) and is ultraviolet curing resin or the like. The bonding member 110 is formed so as to have a rectangular shape in planar view.

The display panel 120 is a display unit in the shape of a flat plate which displays an image. The display panel 120 includes the display area 120b on which an image is displayed, and a frame-shaped frame area 120c by which the perimeter of the display area 120b is enclosed. The display panel 120 has the transmission display function of displaying (forming) an image on the display surface 120a by selectively transmitting a light emitted from the backlight 130 to the display area 120b.

Figure 3:
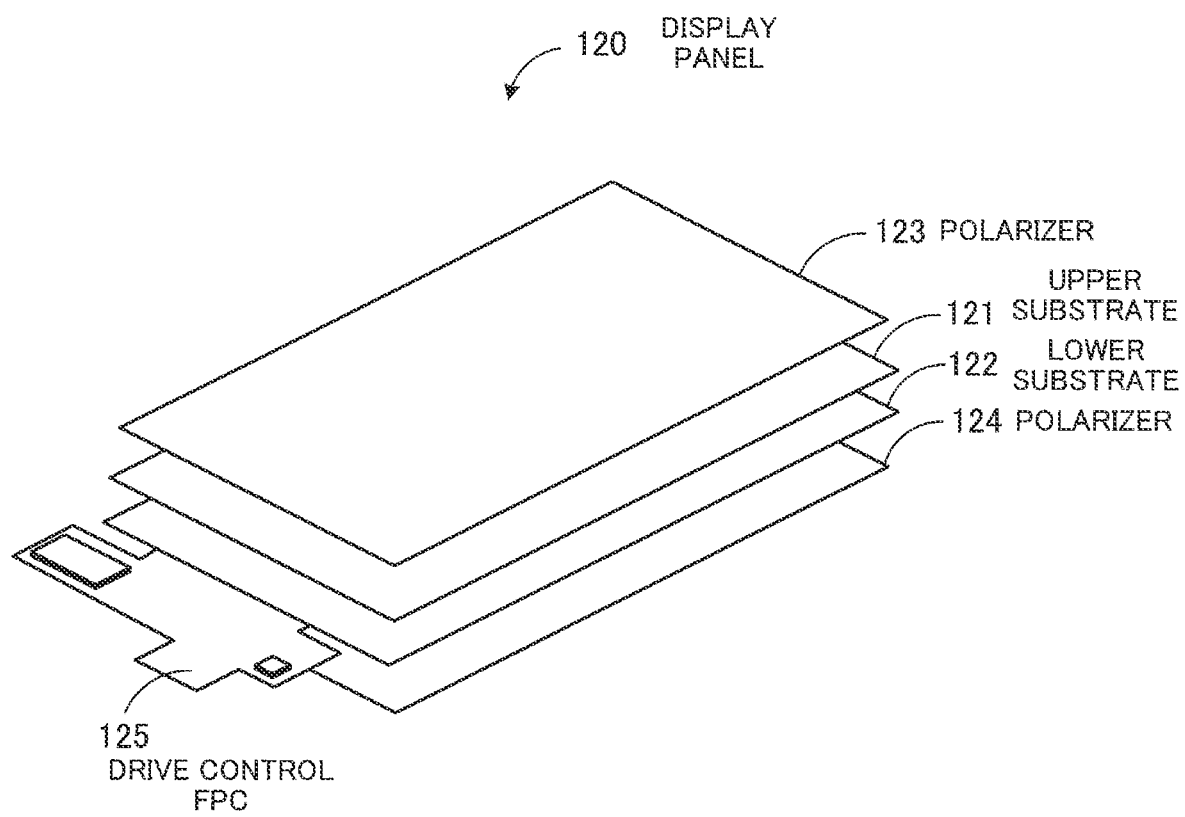
FIG. 3 is an exploded perspective view of a display panel in the first embodiment.

The display panel 120 will now be described more concretely by the use of FIG. 3. FIG. 3 is an exploded perspective view of the display panel in the first embodiment.

The display panel 120 corresponds to a lateral electric field mode as a display mode in which a lateral electric field approximately parallel to the principal plane of a substrate is mainly utilized. The display panel 120 may correspond to a longitudinal electric field mode in which a longitudinal electric field approximately perpendicular to the principal plane of the substrate is mainly utilized.

The display panel 120 includes an upper substrate 121, a lower substrate 122, a polarizer 123, a polarizer 124, and drive control flexible printed circuits (FPC) 125.

The upper substrate 121 and the lower substrate 122 are paired and liquid crystal layer is put between them. The upper substrate 121 is a flat plate having a rectangular shape. For example, red (R), green (G), and blue (B) color filters corresponding to pixels are formed on the upper substrate 121. The lower substrate 122 is a flat plate having a rectangular shape. A thin-film transistor and the like are formed on the lower substrate 122.

The polarizer 123 is disposed on the upper face side (front face side) of the upper substrate 121 and is stuck to the upper substrate 121. The polarizer 123 polarizes a light that is then output from the display panel 120. The polarizer 124 is disposed on the lower face side (back face side) of the lower substrate 122 and is stuck to the lower substrate 122. The polarizer 124 polarizes a light entering the display panel 120.

The drive control FPC 125 is a circuit board on which a semiconductor element, such as an IC chip, is mounted and which supplies a signal needed for driving the display panel 120. The drive control FPC 125 is stuck to the lower substrate 122 and extends from one side of the lower substrate 122 in planar view. On the basis of a signal supplied from the drive control FPC 125, the display panel 120 selectively transmits a light emitted from the backlight 130 to the display area 120b to display an image on the display surface 120a. The description will return to FIGS. 1 and 2.

Figure 4:
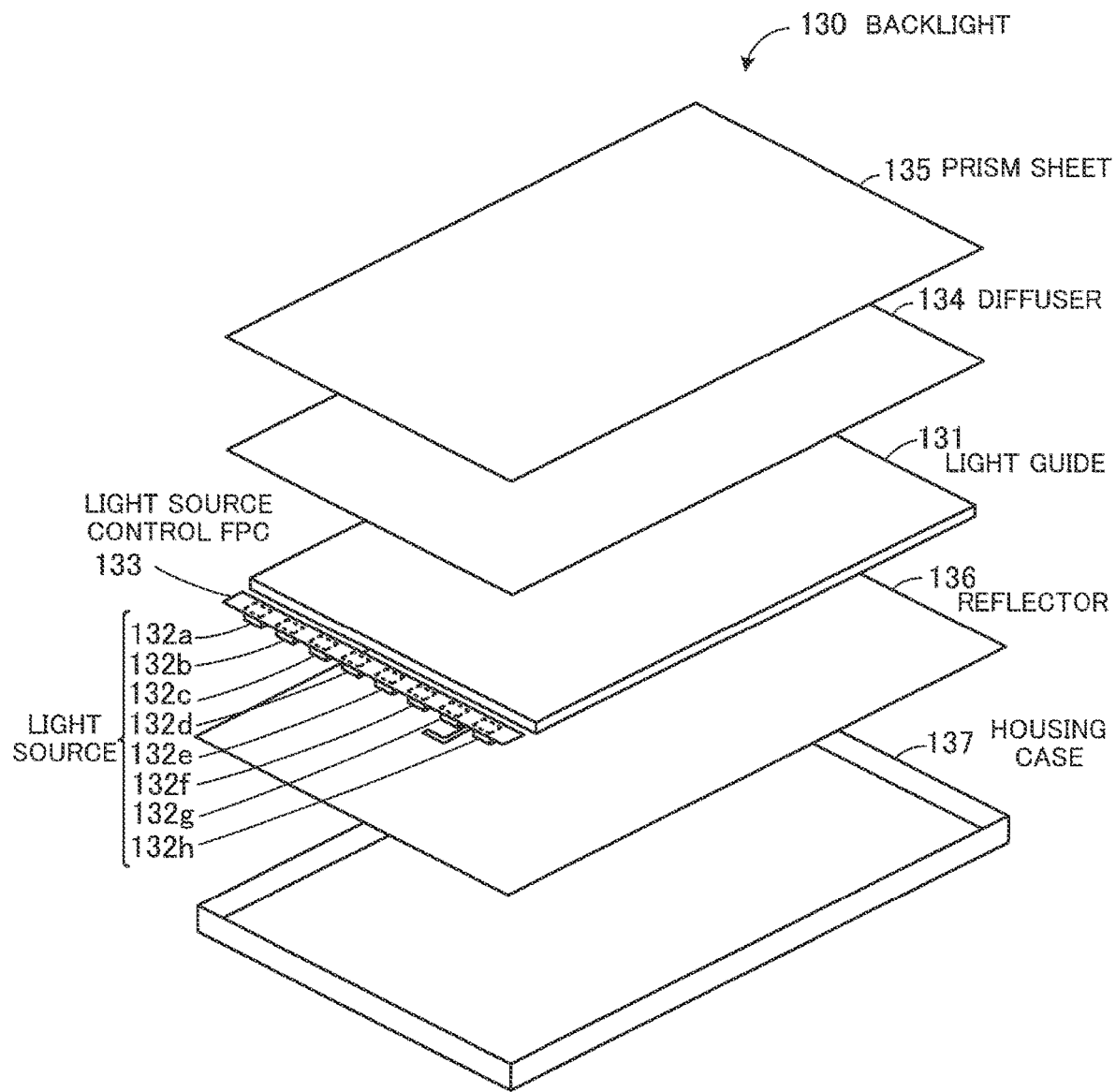
FIG. 4 is an exploded perspective view of a backlight in the first embodiment.

The backlight 130 is disposed on the back face side of the display panel 120 and outputs a light to the back face of the display panel 120 corresponding to the display area 120b. The backlight 130 will now be described concretely by the use of FIG. 4. FIG. 4 is an exploded perspective view of the backlight in the first embodiment.

As illustrated in FIG. 4, the backlight 130 includes a light guide 131, light sources 132a to 132h, a light source control FPC 133, a diffuser 134, a prism sheet 135, a reflector 136, and a housing case 137.

The light guide 131 has a rectangular shape in planar view. The light guide 131 diffuses a light entering the light guide 131 from an side face (hereinafter referred to as the incident face) and outputs a uniform light from a front face (hereinafter referred to as the light output face) toward the back face of the display panel 120. The output light enters the display panel 120 from the back face. The incident face is disposed on a side corresponding to the side on which the drive control FPC 125 of the display panel 120 is disposed.

Each of the light sources 132a to 132h emits a light toward the incident face of the light guide 131. The light sources 132a to 132h are disposed on the light source control FPC 133 along a side of the light guide 131 where the incident face is situated. The light sources 132a to 132h are light emitting diodes (LEDs).

The light source control FPC 133 is a circuit board which supplies signals for driving the light sources 132a to 132h disposed along the incident side of the light guide 131. Part of the light source control FPC 133 extends in planar view in a direction in which the distance from the light guide 131 increases. The extending portion extends outside the housing case 137 in a state in which the backlight 130 is assembled. On the basis of signals supplied from the light source control FPC 133, the backlight 130 controls the light sources 132a to 132h to adjust a light entering the light guide 131 and output the light to the back face of the display panel 120 with a desired intensity.

The diffuser 134 is a transparent optical member disposed on the light output face side of the light guide 131 and adjusts the optical characteristics of a light output from the light output face of the light guide 131. The prism sheet 135 is a transparent optical member disposed on the light output face side of the light guide 131 and adjusts the optical characteristics of a light output from the light output face of the light guide 131. Each of the diffuser 134 and the prism sheet 135 is an example of an optical sheet which adjusts the optical characteristics of a light from the light guide 131.

The reflector 136 is disposed on the back face side of the light guide 131 and is placed over the entire face of the light guide 131. The reflector 136 returns a light from the light guide 131 to the light guide 131. The reflector 136 has the functions of reflection, diffusion, scattering, and the like. As a result, a light entering the light guide 131 from each of the light sources 132a to 132h is efficiently utilized. Furthermore, the reflector 136 contributes to an increase in the intensity of a light emitted from the backlight 130.

The reflector 136 is, for example, foamed polyethylene terephthalate (PET). A silver-evaporated film, a multilayer reflection film, white PET, or the like may be used as the reflector 136.

The housing case 137 houses the members (light guide 131, the light sources 132a to 132h, the light source control FPC 133, the diffuser 134, the prism sheet 135, and the reflector 136) included in the backlight 130.

Figure 5:
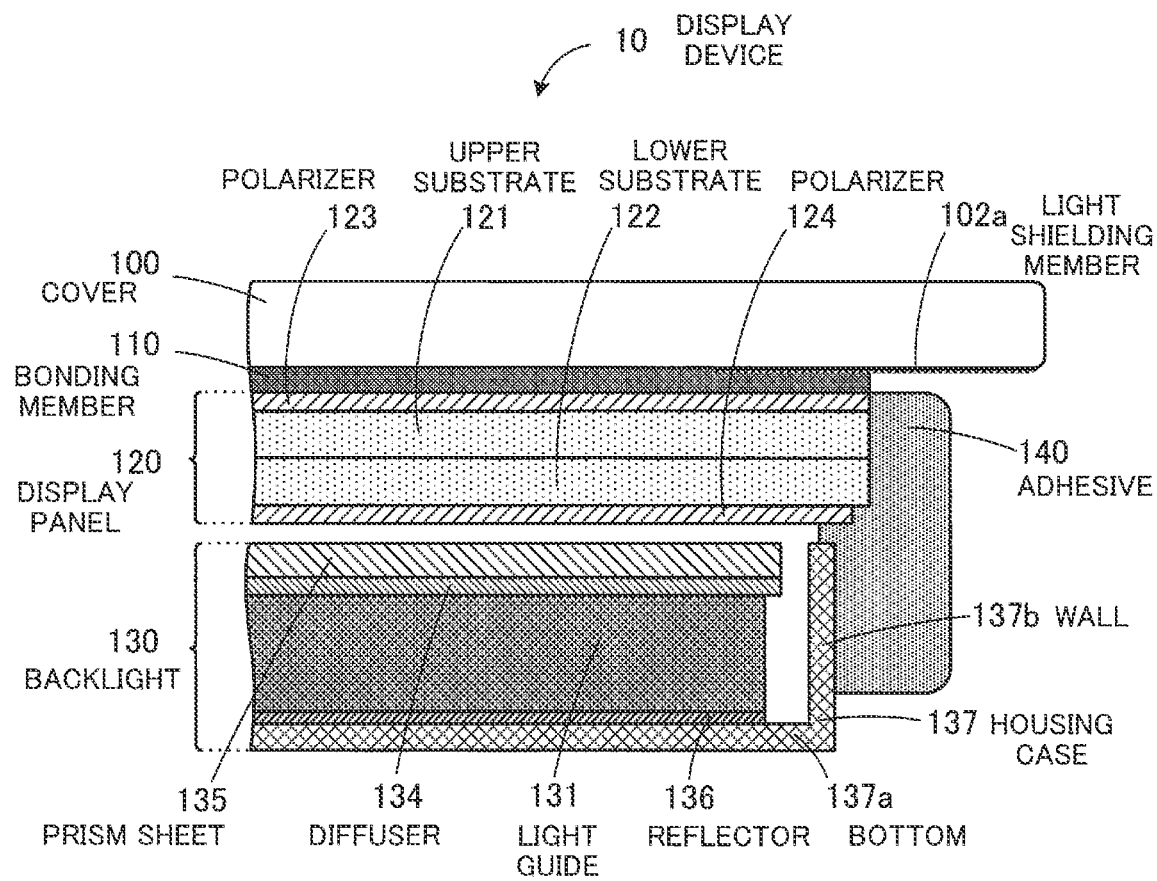
FIG. 5 is a fragmentary sectional view of the display device according to the first embodiment.

The structure of a section of the display device 10 will now be described. FIG. 5 is a fragmentary sectional view of the display device according to the first embodiment. FIG. 5 is a sectional view taken in the direction of the arrow A-A of FIG. 1.

As illustrated in FIG. 5, the housing case 137 of the display device 10 includes a bottom 137a and a wall 137b erecting from a peripheral edge of the bottom 137a toward the display panel 120 side. The height of the wall 137b is such that an upper end face of the wall 137b becomes approximately level with a front face of the prism sheet 135 in a state in which the backlight 130 is assembled.

With the display panel 120 a side face (outer peripheral portion) which is an outer periphery of the display surface 120a includes side faces of the plural members laminated. To be concrete, the side face of the display panel 120 includes the side face of the polarizer 123, the side face of the upper substrate 121, the side face of the lower substrate 122, an area of the back face of the lower substrate 122 where the polarizer 124 is not situated, and the side face of the polarizer 124. Furthermore, with the side face of the display panel 120 of the display device 10, the side face of the polarizer 124 is situated on an inner periphery side of the side faces of the upper substrate 121 and the lower substrate 122 (hereinafter referred to as the pair of substrates). As a result, there is a level difference in the side face of the display panel 120 of the display device 10. In addition, with the display device 10 the wall 137b is situated on the inner periphery side of the side face of the polarizer 124. The upper end face of the wall 137b is opposed to the polarizer 124.

Moreover, with the display device 10 the backlight 130 and the display panel 120 are fixed with an adhesive 140 having a light shielding property and located so as to extend over the outer periphery (outer wall) of the wall 137b and the side face of the display panel 120. The adhesive 140 is applied to the entire side face of the display panel 120 (side faces of the polarizer 123, the pair of substrates, and the polarizer 124). Furthermore, a face of the adhesive 140 on a side opposite to a side on which the side face of the display panel 120 and the outer periphery of the wall 137b are situated, that is to say, a face (hereinafter referred to as the outer face) of the adhesive 140 opposite to a bonding face is flattened so as to be parallel or approximately parallel to one or both of the side face of the display panel 120 and the outer periphery of the wall 137b.

As a result, the outer face of the adhesive 140 is formed as a flat face along one or both of the side face of the display panel 120 and the outer periphery of the wall 137b. Furthermore, a portion (from the wall 137b to the outer face of the adhesive 140) of the adhesive 140 corresponding to the wall 137b is thicker than a portion (from the display panel 120 to the outer face of the adhesive 140) of the adhesive 140 corresponding to the display panel 120. For example, urethane-based moisture curable, reactive hot melt adhesive is used as the adhesive 140.

By bonding the display panel 120 and the backlight 130 together in this way at the side face of the display panel 120, the distance between the peripheral edge of the display surface 120a and the display area 120b is shortened. That is to say, the display area 120b becomes larger and a narrow frame is realized.

A case where a back face of a display panel is fixed to a backlight will now be described as an example for comparison. If a back face of a display panel is fixed to a backlight, a display device includes, for example, a frame in a position on the backlight corresponding to the peripheral edge of the back face of the display panel. By bonding the frame and the back face of the display panel together, the display panel and the backlight are fixed. In this case, the display device includes an adhesive member (such as an adhesive tape) on the peripheral edge of the back face of the display panel.

If the adhesive member overlaps with a display area in planar view, the adhesive member may be visible at the time of looking into the display area or the display quality of an image displayed in the display area may be affected. That is to say, it is not desirable to place the adhesive member in an area which overlaps with the display area. Accordingly, if the back face of the display panel is fixed to the backlight, usually an area of a display surface corresponding to a portion where the adhesive member is placed is used as a frame area (non-display area).

That is to say, if the back face of the display panel is fixed to the backlight, the display area is set inside the area of the display surface corresponding to the portion where the adhesive member is placed. In addition, in order to realize determined fixing strength, there is a need to place an adhesive member having a certain width or more in the display device. Therefore, it is difficult to realize a narrow frame by narrowing an area where the adhesive member is placed.

On the other hand, with the display device 10 the display panel 120 and the backlight 130 are fixed at the side face of the display panel 120. Therefore, when the display area 120b is set, the following restriction, for example, is not imposed. If the back face of the display panel is fixed to the backlight, there is a need to avoid an overlap of the adhesive 140 with the display area 120b.

Accordingly, the distance between the peripheral edge of the display surface 120a and the display area 120b is shortened to make the display area 120b large. That is to say, by adopting the display device 10 having the above structure, a display device having a narrow frame is realized.

In addition, because the outer face of the adhesive 140 in the display device 10 is flattened so as to be parallel or approximately parallel to one or both of the side face of the display panel 120 and the outer periphery of the wall 137b, a portion of the adhesive 140 protruding from the side face of the display panel 120 and the outer periphery of the wall 137b is small compared with a case where the outer face of the adhesive 140 in the display device 10 is not flattened. Usually the size of the cover 100 formed is as follows. The cover 100 protrudes from the outer face of the adhesive 140 so that the cover 100 will be placed over the entire area of each of the display panel 120, the housing case 137, and the adhesive 140. Accordingly, if a portion of the adhesive 140 protruding from the side face of the display panel 120 and the outer periphery of the wall 137b is large, there is a need to make a portion of the cover 100 protruding from the display panel 120 large with the protruding portion of the adhesive 140 taken into consideration. On the other hand, with the display device 10 the outer face of the adhesive 140 is flattened along the side face of the display panel 120 and the outer periphery of the wall 137b. As a result, the protruding portion of the adhesive 140 is small. Therefore, a portion of the cover 100 protruding from the display panel 120 is small. That is to say, by adopting the display device 10 having the above structure, the width of an area where the light shielding member 102a is placed is decreased and a display device having a narrow frame is realized.

Moreover, with the display device 10 the side face of the polarizer 124 is situated on the inner periphery side of the side face of the lower substrate 122 to form the level difference in the side face of the display panel 120. This increases the bonding area of the adhesive 140. As a result, bonding strength between the display panel 120 and the adhesive 140 is improved.

Furthermore, the outer face of the adhesive 140 is flattened so as to be parallel or approximately parallel to one or both of the side face of the display panel 120 and the outer periphery of the wall 137b. As a result, even if the side face of the display panel 120 and a side face of the backlight 130 are rough (not flat), the outer face of the adhesive 140 is flattened. This prevents, at the time of incorporating the display device 10 into an electronic apparatus or the like, a part in the electronic apparatus or the like from catching the adhesive 140.

In addition, the adhesive 140 having a light shielding property is applied to the side face of the display panel 120. As a result, the whole of the side face of the display panel 120 is covered with the adhesive 140. This prevents a light emitted from the backlight 130 from leaking out from the side face of the display panel 120.

Furthermore, the wall 137b is situated on the inner periphery side of the side face of the display panel 120. As a result, a portion of the cover 100 protruding from the display panel 120 is small compared with a case where the wall 137b is placed on an outer periphery side of the side face of the display panel 120. Usually the formation of a narrow frame involves forming the adhesive 140 as thinly as possible, while ensuring bonding strength. That is to say, the adhesive 140 is formed so as to ensure desired bonding strength even in outermost portions of the side face of the display panel 120 and the outer periphery of the wall 137b. Accordingly, if the side face of the display panel 120 is situated on the inner periphery side of the wall 137b, there is a need to set the thickness of a portion of the adhesive 140 corresponding to the wall 137b to a value by which bonding strength is ensured. Accordingly, a portion of the adhesive 140 corresponding to the side face of the display panel 120 becomes thicker. As a result, a portion of the cover 100 protruding from the display panel 120 becomes larger.

On the other hand, with the display device 10 the side face of the display panel 120 is placed on the outer periphery side of the wall 137b. This makes it possible to make a portion of the adhesive 140 corresponding to the side face of the display panel 120 thin and to make a portion of the cover 100 protruding from the display panel 120 small. That is to say, by adopting the display device 10 having the above structure, the width of an area where the light shielding member 102a is placed is narrow compared with a case where the outer periphery of the wall 137b is placed on the outer periphery side of (outside) the side face of the display panel 120. As a result, a display device having a narrow frame is realized.

A method for fixing the display panel 120 and the backlight 130 with the adhesive 140 and flattening the outer face of the adhesive 140 to make the outer face of the adhesive 140 parallel or approximately parallel to one or both of the side face of the display panel 120 and the outer periphery of the wall 137b will now be described by the use of FIGS. 6A through 6C. FIGS. 6A through 6C illustrate an example of a bonding procedure in the first embodiment based on the method of direct application of the adhesive. With this direct application method the adhesive 140 is applied directly so as to extend over the side face of the display panel 120 and the outer periphery of the wall 137b.

The direct application method is as follows. As illustrated in FIG. 6A, first the display panel 120 and the backlight 130 are put together so that the upper end face (end face) of the wall 137b will be in contact with the display panel 120 or be opposed to the display panel 120 with a determined space therebetween. The outer periphery of the wall 137b and the side face of the display panel 120 are then faced upward. The liquid adhesive 140 is then delivered from a needle or the like and a determined amount of the adhesive 140 is placed (applied) so as to extend over the side face of the display panel 120 and the outer periphery of the wall 137b.

After the adhesive 140 hardens to determined strength and the surface adhesive force of a portion of the adhesive 140 which is in contact with air lowers, the adhesive 140 is pressed, as illustrated in FIG. 6B, against the side face of the display panel 120 and the outer periphery of the wall 137b with a flattening member 150 having the shape of a flat plate and this state is maintained for a determined time. By doing so, the outer face of the adhesive 140 is flattened so as to be parallel or approximately parallel to one or both of the side face of the display panel 120 and the outer periphery of the wall 137b.

For example, until a load prescribed in advance is applied to the adhesive 140, the adhesive 140 is pressed against the side face of the display panel 120 and the outer periphery of the wall 137b with the flattening member 150.

The adhesive 140 may be pressed against the side face of the display panel 120 and the outer periphery of the wall 137b until a determined positional relationship is formed between a face of the flattening member 150 which is in contact with the adhesive 140 and the side face of the display panel 120 and the outer periphery of the wall 137b. In this case, the thickness of the adhesive 140 in the display device 10 is set to a value corresponding to the positional relationship between the face of the flattening member 150 which is in contact with the adhesive 140 and the side face of the display panel 120 and the outer periphery of the wall 137b.

After that, as illustrated in FIG. 6C, the flattening member 150 is removed. At this time the adhesive 140 is pressed against the side face of the display panel 120 and the outer periphery of the wall 137b with the flattening member 150 after the surface adhesive force lowers. Accordingly, the adhesive 140 is not bonded to the flattening member 150 and the display device 10 illustrated in FIG. 5 is completed. The bonding procedure based on the direct application method has been described. In the above description, the outer periphery of the wall 137b and the side face of the display panel 120 are faced upward to bond the display panel 120 and the backlight 130 together. However, another method may be used. For example, the display panel 120 and the backlight 130 may be bonded together in a state in which the outer periphery of the wall 137b of the housing case 137 and the side face of the display panel 120 are faced in a lateral direction, depending on the viscosity or the like of an adhesive.

Another bonding method will now be described by the use of FIGS. 7A through 7D. FIGS. 7A through 7D illustrate an example of a bonding procedure in the first embodiment based on an adhesive transfer method. With this transfer method, after the liquid adhesive 140 is placed on (applied to) the flattening member 150 as a temporary measure, the adhesive 140 is transferred from the flattening member 150 to the side face of the display panel 120 and the outer periphery of the wall 137b.

The transfer method is as follows. As illustrated in FIG. 7A, first a release film 151 is stuck on a flat face of the flattening member 150. After that, the liquid adhesive 140 is delivered from a needle or the like with the flat face of the flattening member 150 faced upward to place (apply) a determined amount of the adhesive 140 on (to) the release film 151.

As illustrated in FIG. 7B, the face of the flattening member 150 to which the adhesive 140 is applied is then faced toward the side face of the display panel 120 and the outer periphery of the wall 137b and the flattening member 150 is brought near a portion to which the adhesive 140 is to be applied.

As illustrated in FIG. 7C, the flattening member 150 is brought nearer the portion to which the adhesive 140 is to be applied, and the adhesive 140 is pressed against the side face of the display panel 120 and the outer periphery of the wall 137b. By doing so, the adhesive 140 is bonded to the side face of the display panel 120 and the outer periphery of the wall 137b.

After the adhesive 140 hardens to determined strength in a state in which the flattening member 150 is pressed against the side face of the display panel 120 and the outer periphery of the wall 137b, the flattening member 150 is removed as illustrated in FIG. 7D. At this time the adhesive 140 is applied to the flattening member 150 with the release film 151 therebetween. Accordingly, the adhesive 140 peels off the flattening member 150 because of the peeling property of the release film 151 and the display device 10 illustrated in FIG. 5 is completed. The bonding procedure based on the transfer method has been described.

Because the adhesive 140 is held in this way in a state in which the adhesive 140 is put between the flattening member 150 and the side face of the display panel 120 and the outer periphery of the wall 137b, the adhesive 140 does not drip at hardening time. Therefore, there is no need to face the face to which the adhesive 140 is applied upward. With the transfer method bonding may be performed simultaneously on plural sides of the display device 10.

Furthermore, with the transfer method the adhesive 140 is hardened to determined strength in a state in which the outer face of the adhesive 140 is flattened so as to be parallel or approximately parallel to one or both of the side face of the display panel 120 and the outer periphery of the wall 137b. As a result, the outer face of the adhesive 140 is flattened favorably compared with a case where the direct application method is used.

Coating or the like may be performed on the flat face of the flattening member 150 in place of sticking the release film 151 on the flat face of the flattening member 150.

In the descriptions of FIGS. 5 and 6, the cover 100 has been fixed to the display panel 120 with the bonding member 110. However, the cover 100 may be fixed to the display panel 120 at another timing. The cover 100 may be fixed to the display panel 120 after or before the display panel 120 and the backlight 130 are bonded together.

For example, if the cover 100 is fixed to the display panel 120 before the display panel 120 and the backlight 130 are bonded together, then the side face of the bonding member 110 may be covered with the adhesive 140 with which the display panel 120 and the backlight 130 are bonded together. In addition, in this case, the adhesive 140 may be in contact with (be bonded to) the back face of the cover 100.

The first embodiment has been described. The structure of the right side portion (A-A portion) of the display device 10 has been described. However, the above structure is not limited to the right side portion of the display device 10. A section of each of a left side portion (see FIG. 1) and an upper side portion (see FIG. 1) of the display device 10 may have the same structure that a section of the A-A portion (right side portion in FIG. 1) of the display device 10 has.

Second Embodiment

Figure 8:
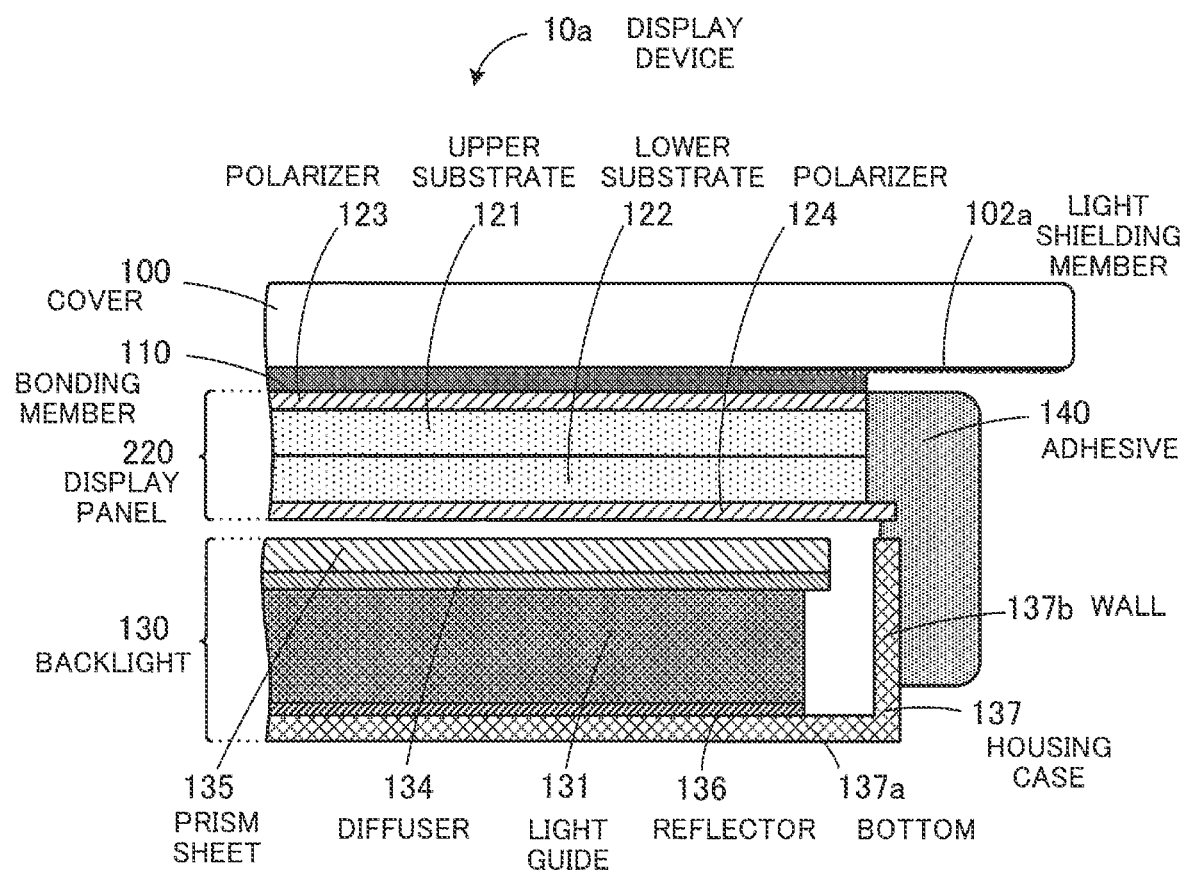
FIG. 8 is a fragmentary sectional view of a display device according to a second embodiment.

A second embodiment differs from the first embodiment in the positional relationship between a wall of a housing case and side faces of a pair of substrates of a display panel. Description will now be given with importance attached especially to the differences between the first embodiment and a second embodiment. A second embodiment will be described concretely by the use of FIG. 8. FIG. 8 is a fragmentary sectional view of a display device according to a second embodiment. FIG. 8 illustrates a partial section of a display device according to a second embodiment corresponding to the partial section illustrated in FIG. 5.

With a display device 10a according to a second embodiment a display panel 220 is used in place of the display panel 120 used in the display device 10 according to the first embodiment. With the display panel 220, a side face of a polarizer 124 protrudes from side faces of a pair of substrates and a level difference is formed in a side face of the display panel 220.

As illustrated in FIG. 8, with the display device 10a a wall 137b of a housing case 137 is situated on an outer periphery side of the side faces of the pair of substrates of the display panel 220. Furthermore, a portion of the polarizer 124 protruding from the side faces of the pair of substrates is extended to a position opposite the wall 137b. Moreover, an adhesive 140 is applied so as to extend over the side face of the display panel 220 and an outer periphery (outer wall) of the wall 137b, and a backlight 130 and the display panel 220 are fixed. The adhesive 140 is applied to the entire side face of the display panel 220 (side faces of a polarizer 123, the pair of substrates, and the polarizer 124). In addition, the adhesive 140 is flattened so as to be parallel or approximately parallel to one or both of the side face of the display panel 220 and the outer periphery of the wall 137b.

As a result, an outer face of the adhesive 140 is formed as a flat face along one or both of the side face of the display panel 220 and the outer periphery of the wall 137b. Furthermore, a portion of the adhesive 140 corresponding to the wall 137b (from the wall 137b to the outer face of the adhesive 140) is thinner than a portion of the adhesive 140 corresponding to the pair of substrates (from the display panel 220 to the outer face of the adhesive 140).

As has been described, with the display device 10a the wall 137b is situated on the outer periphery side of the side faces of the pair of substrates. Even in this case, the polarizer 124 protrudes and is opposed to an upper end face of the wall 137b. By doing so, a portion of the display panel 220 opposed to the upper end face of the wall 137b is ensured. As a result, the adhesive 140 is placed between the polarizer 124 (display panel 220) and the upper end face of the wall 137b to bond the polarizer 124 and the upper end face of the wall 137b together. Accordingly, the display panel 220 and the backlight 130 are fixed firmly.

Furthermore, the side face of the polarizer 124 protrudes from the side faces of the pair of substrates and the level difference is formed in the side face of the display panel 220. This increases the bonding area of the adhesive 140. As a result, bonding strength between the display panel 220 and the adhesive 140 is improved. In addition, the side face of the polarizer 124 protrudes from the side faces of the pair of substrates and the polarizer 124 is opposed to the wall 137b. Accordingly, the shape of the adhesive 140 on the bonding face side is uneven and bonding strength is improved.

A section of each of a left side portion and an upper side portion of the display device 10a according to the second embodiment may have the same bonding structure that a section of the right side portion of the display device 10a has.

The second embodiment has been described. The same functions and effects are also obtained for matters in the second embodiment which are the same as those in the above first embodiment.

Furthermore, of course it is understood that other functions and effects which are obtained by the situation described in the second embodiment and which are clear from the specification or which are conceivable by those skilled in the art according to circumstances are realized by the present disclosure.

Third Embodiment

Figure 9:
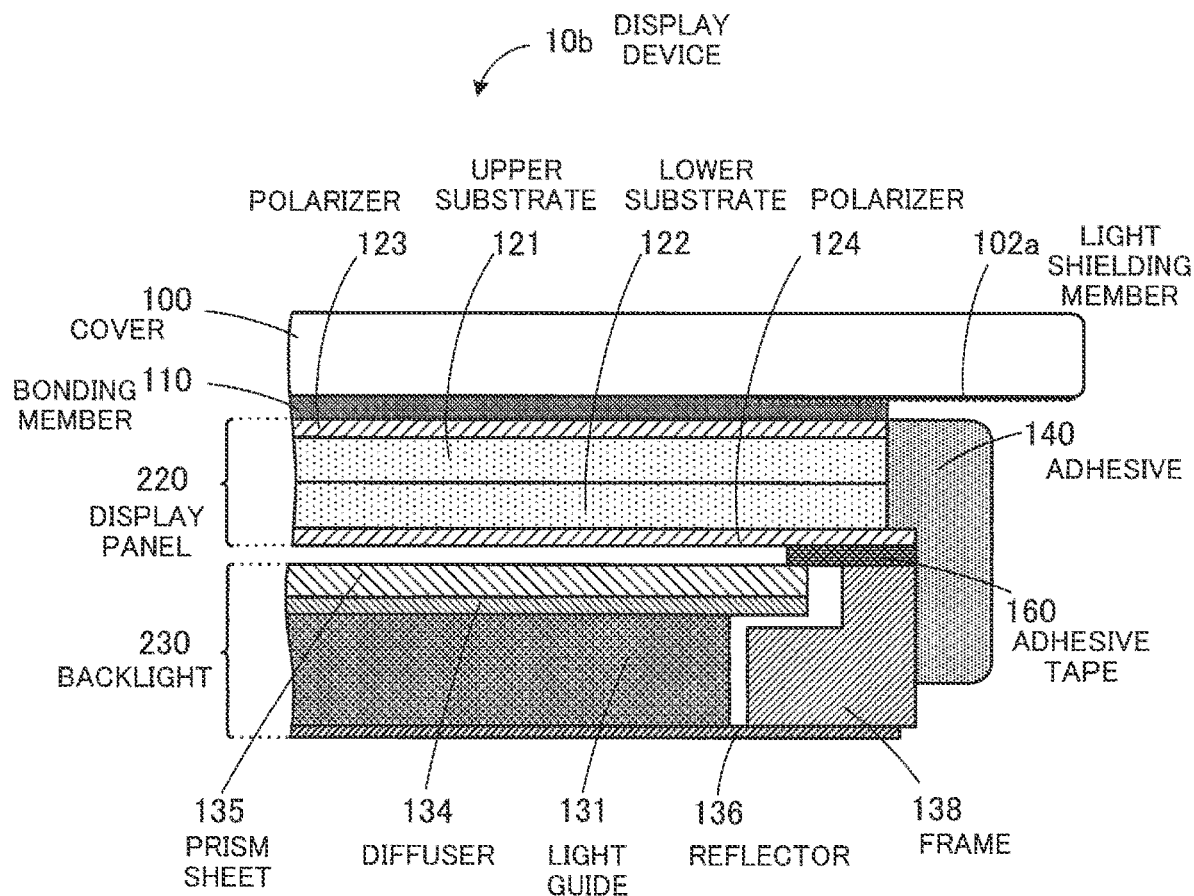
FIG. 9 is a fragmentary sectional view of a display device according to a third embodiment.

A third embodiment differs from the second embodiment in that a housing case is removed and in that a frame is used. Description will now be given with importance attached especially to the differences between the second embodiment and a third embodiment. A third embodiment will be described concretely by the use of FIG. 9. FIG. 9 is a fragmentary sectional view of a display device according to a third embodiment. FIG. 9 illustrates a partial section of a display device according to a third embodiment corresponding to the partial section illustrated in FIG. 5.

With a display device 10b according to a third embodiment a backlight 230 is used in place of the backlight 130 used in the display device 10a according to the second embodiment. The backlight 230 includes a light guide 131, a frame 138 placed so as to enclose the light guide 131, and a diffuser 134 and a prism sheet 135 placed on a side of the light guide 131 on which a display panel 220 is situated. Furthermore, the backlight 230 includes a reflector 136 placed on a side of the light guide 131 and the frame 138 opposite to the side on which the display panel 220 is situated. The frame 138 has a stepped shape (also referred to as an L shape) and its lower portion protrudes from its upper portion to an inner periphery side in a cross-sectional view. In addition, the frame 138 is placed so that its outer face (outer periphery) will be situated outside (on an outer periphery side of) side faces of a pair of substrates. The frame 138 may not have a stepped shape. That is to say, its lower portion may not protrude from its upper portion to the inner periphery side in a cross-sectional view. For example, the inner periphery side of the frame 138 may be flattened in a cross-sectional view.

As illustrated in FIG. 9, with the display device 10b an adhesive tape 160, which is a double-faced tape, having a light shielding property is bonded to an upper end face of the frame 138, a front face of the prism sheet 135, and a back face of a polarizer 124 to fix the display panel 220 and the backlight 230.

Furthermore, an adhesive 140 is applied so as to extend over a side face of the display panel 220, the adhesive tape 160, and the outer face (outer periphery) of the frame 138. By doing so, the display panel 220 and the backlight 230 are fixed. The adhesive 140 is applied to the entire side face of the display panel 220 (side faces of a polarizer 123, the pair of substrates, and the polarizer 124). In addition, the adhesive 140 is flattened so as to be parallel or approximately parallel to one or both of the side face of the display panel 220 and the outer face (outer periphery) of the frame 138.

As a result, an outer face of the adhesive 140 is formed as a flat face along one or both of the side face of the display panel 220 and the outer periphery of the frame 138. Furthermore, a portion of the adhesive 140 corresponding to the frame 138 (from the frame 138 to the outer face of the adhesive 140) is thinner than a portion of the adhesive 140 corresponding to the display panel 220 (from the display panel 220 to the outer face of the adhesive 140).

With the display device 10b the display panel 220 and the backlight 230 are fixed in this way with the adhesive tape 160 and the adhesive 140. As a result, the display panel 220 and the backlight 230 are fixed more firmly.

That is to say, there is no need to ensure desired fixing strength only by a back face of the display panel 220. Accordingly, areas to which the adhesive tape 160 is bonded are narrow compared with a case where the display panel 220 and the backlight 230 are fixed only with the adhesive tape 160. As a result, a narrow frame is realized.

In addition, the adhesive tape 160 is placed between the frame 138 and the polarizer 124. This prevents the adhesive 140 from infiltrating into the inside. As a result, the influence of the adhesive 140 on display quality is curbed. Furthermore, the adhesive tape 160 is placed to end portions of the optical sheets (prism sheet 135 and the diffuser 134). This makes the end portions of the optical sheets look better.

A section of each of a left side portion and an upper side portion of the display device 10b according to the third embodiment may have the same bonding structure that a section of the right side portion of the display device 10b has.

The third embodiment has been described. The same functions and effects are also obtained for matters in the third embodiment which are the same as those in each of the above embodiments.

Furthermore, of course it is understood that other functions and effects which are obtained by the situation described in the third embodiment and which are clear from the specification or which are conceivable by those skilled in the art according to circumstances are realized by the present disclosure.

Fourth Embodiment

Figure 10:
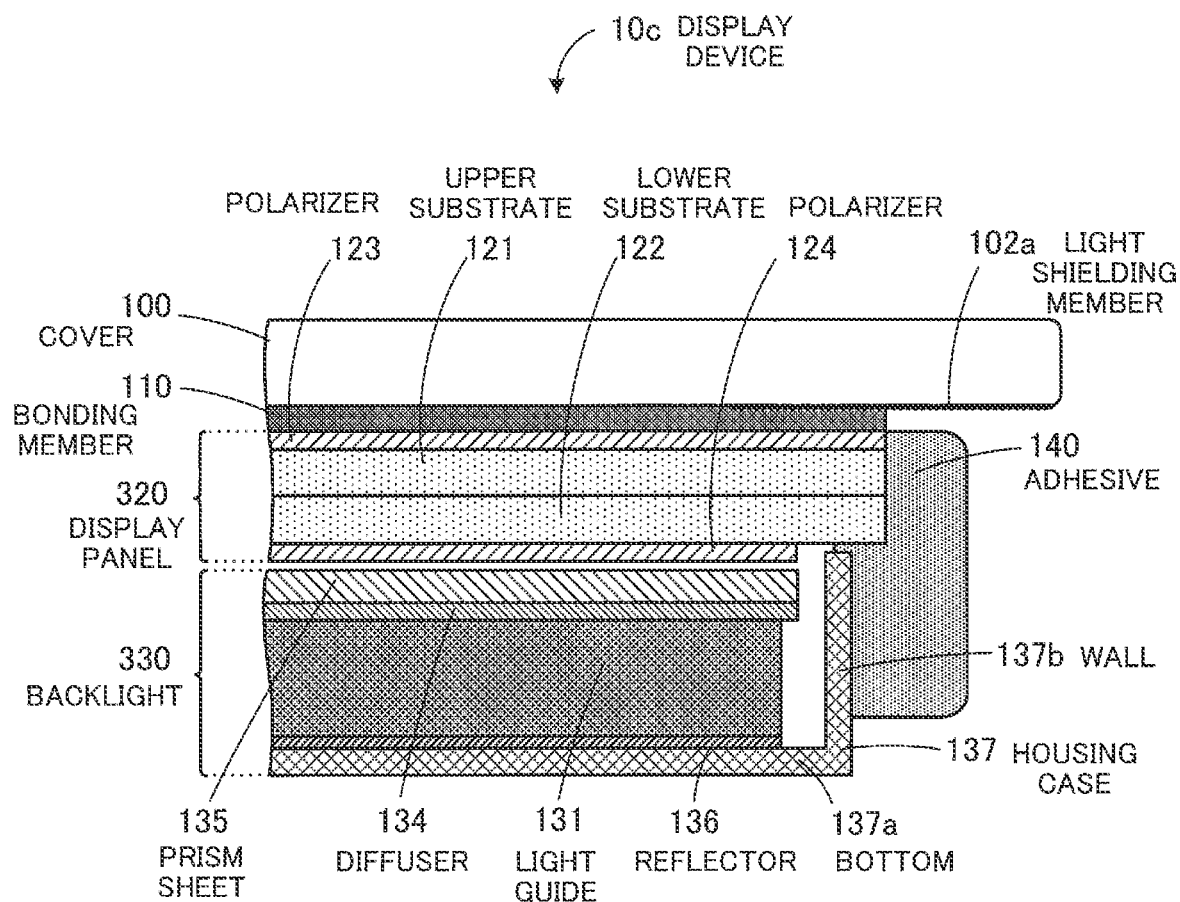
FIG. 10 is a fragmentary sectional view of a display device according to a fourth embodiment.

A fourth embodiment differs from the first embodiment in that a wall is opposed to a lower substrate. Description will now be given with importance attached especially to the differences between the first embodiment and a fourth embodiment. A fourth embodiment will be described concretely by the use of FIG. 10. FIG. 10 is a fragmentary sectional view of a display device according to a fourth embodiment. FIG. 10 illustrates a partial section of a display device according to a fourth embodiment corresponding to the partial section illustrated in FIG. 5.

With a display device 10c according to a fourth embodiment a backlight 330 is used in place of the backlight 130 used in the display device 10 according to the first embodiment. With the backlight 330 the size of a wall 137b of a housing case 137 formed is such that the wall 137b extends above a front face of a prism sheet 135.

Furthermore, with the display device 10c a display panel 320 is used in place of the display panel 120 used in the display device 10 according to the first embodiment. With the display panel 320 a side face of a polarizer 124 is situated on an inner periphery side of the wall 137b.

As illustrated in FIG. 10, an upper end face of the wall 137b is opposed on the inner periphery side of side faces of a pair of substrates to a portion of a lower substrate 122 where the polarizer 124 is not placed. Moreover, the upper end face of the wall 137b is situated above a face on the backlight 330 side of the polarizer 124. Furthermore, an adhesive 140 is applied so as to extend over a side face of the display panel 320 and an outer periphery (outer wall) of the wall 137b. By doing so, the backlight 330 and the display panel 320 are fixed. The adhesive 140 is applied to an entire side face of a polarizer 123 and the entire side faces of the pair of substrates. In addition, the adhesive 140 is flattened so as to be parallel or approximately parallel to one or both of the side face of the display panel 320 and the outer periphery of the wall 137b.

As a result, an outer face of the adhesive 140 is formed as a flat face along one or both of the side face of the display panel 320 and the outer periphery of the wall 137b. Furthermore, a portion of the adhesive 140 corresponding to the wall 137b (from the wall 137b to the outer face of the adhesive 140) is thicker than a portion of the adhesive 140 corresponding to the pair of substrates (from the pair of substrates to the outer face of the adhesive 140).

With the display device 10c the upper end face of the wall 137b is opposed in this way to the lower substrate 122. Even in this case, the upper end face of the wall 137b is situated above the face on the backlight 330 side of the polarizer 124 and is close to the lower substrate 122. As a result, the display device 10c is thin. Moreover, the wall 137b is placed on the inner periphery side of the side face of the display panel 320. Accordingly, a portion of a cover 100 protruding from the display panel 320 is small compared with a case where the wall 137b is placed on an outer periphery side of the side face of the display panel 320. That is to say, by adopting the display device 10c having the above structure, the width of an area where a light shielding member 102a is placed is narrow compared with a case where the outer periphery of the wall 137b is placed on an outer periphery side of (outside) the side face of the display panel 320. As a result, a display device having a narrow frame is realized.

A section of each of a left side portion and an upper side portion of the display device 10c according to the fourth embodiment may have the same bonding structure that a section of the right side portion of the display device 10c has.

The fourth embodiment has been described. The same functions and effects are also obtained for matters in the fourth embodiment which are the same as those in each of the above embodiments.

Furthermore, of course it is understood that other functions and effects which are obtained by the situation described in the fourth embodiment and which are clear from the specification or which are conceivable by those skilled in the art according to circumstances are realized by the present disclosure.

Fifth Embodiment

Figure 11:
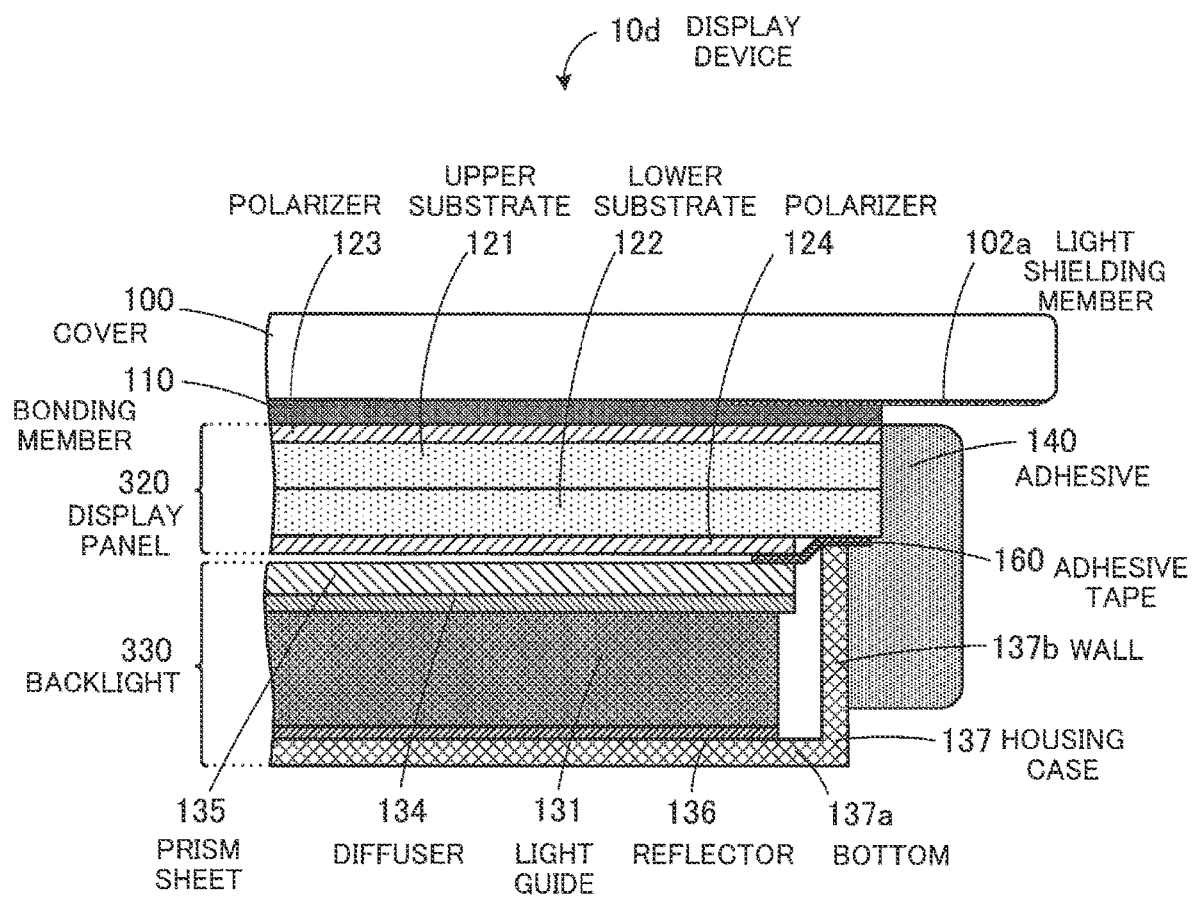
FIG. 11 is a fragmentary sectional view of a display device according to a fifth embodiment.

A fifth embodiment differs from the fourth embodiment in that an adhesive tape is used. Description will now be given with importance attached especially to the differences between the fourth embodiment and a fifth embodiment. A fifth embodiment will be described concretely by the use of FIG. 11. FIG. 11 is a fragmentary sectional view of a display device according to a fifth embodiment. FIG. 11 illustrates a partial section of a display device according to a fifth embodiment corresponding to the partial section illustrated in FIG. 5.

As illustrated in FIG. 11, with a display device 10d an adhesive tape 160 bonds a wall 137b of a housing case 137 and a lower substrate 122 together to fix a backlight 330 and a display panel 320. Furthermore, the adhesive tape 160 is extended to the inside of the housing case 137 and bonds a polarizer 124 and a prism sheet 135 together to fix the backlight 330 and the display panel 320. Furthermore, an adhesive 140 is applied so as to extend over a side face of the display panel 320, the adhesive tape 160, and an outer periphery (outer wall) of the wall 137b. By doing so, the backlight 330 and the display panel 320 are fixed. The adhesive 140 is applied to an entire side face of a polarizer 123 and entire side faces of a pair of substrates. In addition, the adhesive 140 is flattened so as to be parallel or approximately parallel to one or both of the side face of the display panel 320 and the outer periphery of the wall 137b.

As a result, an outer face of the adhesive 140 is formed as a flat face along one or both of the side face of the display panel 320 and the outer periphery of the wall 137b. Furthermore, a portion of the adhesive 140 corresponding to the wall 137b (from the wall 137b to the outer face of the adhesive 140) is thicker than a portion of the adhesive 140 corresponding to the pair of substrates (from the pair of substrates to the outer face of the adhesive 140).

With the display device 10d the adhesive tape 160 is placed in this way between the wall 137b and the lower substrate 122. This prevents the adhesive 140 from infiltrating into the inside. As a result, the influence of the adhesive 140 on display quality is curbed. Furthermore, the adhesive tape 160 is placed to end portions of optical sheets (prism sheet 135 and a diffuser 134). This makes the end portions of the optical sheets look better.

A section of each of a left side portion and an upper side portion of the display device 10d according to the fifth embodiment may have the same bonding structure that a section of the right side portion of the display device 10d has.

The fifth embodiment has been described. The same functions and effects are also obtained for matters in the fifth embodiment which are the same as those in each of the above embodiments.

Furthermore, of course it is understood that other functions and effects which are obtained by the situation described in the fifth embodiment and which are clear from the specification or which are conceivable by those skilled in the art according to circumstances are realized by the present disclosure.

Moreover, the display devices each including the display panel having the shape of a rectangular flat plate have been described. However, the same applies to another display device. For example, the same applies to a display device including a display panel having a round shape, an elliptic shape, a polygonal shape, or the like or a display device including a curved panel.

The display devices described in the above embodiments may be incorporated in various electronic apparatus such as smartphones, tablet terminals, portable telephones, notebook-sized PCs, portable game machines, electronic dictionaries, television sets, and car navigation systems.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A display device comprising:
   a display panel with a side surface;
   a backlight under the display panel;
   a cover plate covering the display panel, the display panel being located between the cover plate and the backlight;
   a housing case housing members included in the backlight, and including a bottom and a wall which rises from a peripheral edge of the bottom toward a display panel side, the bottom and the wall being formed in one body; and an adhesive placed so as to extend over the side surface of the display panel and the wall of the housing case,
wherein:
the wall has a first side face facing the members and a second side face opposite of the first side face, the first side face being between the members and the second side face;
the adhesive is placed on the side surface of the display panel and the second side face, and has an inside face and an outer face opposite to the inside face, the inside face being in contact with the second side face;
the outer face is not in contact with any frames and housing cases, and
the adhesive is not in contact with the cover plate.

2. The display device according to claim 1, wherein:
the inside face is between the second side face and the outer face, and is in contact with the side surface of the display panel and the second side face; and
a distance between the outer face and the side surface of the display panel is different from a distance between the outer face and the second side face.

3. The display device according to claim 1, wherein:
the cover plate overlaps the adhesive in a plan view, and has a light shielding member; and
the light shielding member faces the adhesive with a gap.

4. The display device according to claim 1, wherein:
the display panel includes:
   a pair of substrates between which a liquid crystal layer is put, the pair of substrates having a main surface and a third side face; and
   a polarizer which is placed on a backlight side of the pair of substrates and which includes a fourth side face which does not intersect the main surface;
the side surface of the display panel includes the third and fourth side faces;
the wall is in contact with the polarizer or opposed to the polarizer with a narrow space therebetween; and
the adhesive is placed so as to extend over the second to fourth side faces.

5. The display device according to claim 1, wherein:
the display panel includes:
   a pair of substrates between which a liquid crystal layer is put, the pair of substrates having a main surface and a third side face; and
   a polarizer which is placed on a backlight side of the pair of substrates which includes a fourth side face which does not intersect the main surface; and
the side surface of the display panel includes the third and fourth side faces;
the wall is fixed to the polarizer with a double-faced tape; and
the adhesive is placed so as to extend over the double-faced tape and the second to fourth side faces.

6. The display device according to claim 1, wherein:
the adhesive has an inside face and an outer face opposite to the inside face;
the inside face is between the second side face and the outer face, and is in contact with the side surface of the display panel and the second side face; and
the outer face includes a flat face along at least one of the side surface of the display panel and the second side face.

7. The display device according to claim 1, wherein the bottom and the wall are seamless and are formed of a same material.

8. The display device according to claim 1, wherein the housing case is formed in a box shape.

9. A display device comprising:
a display panel with a side surface;
a case formed in a box shape, including a bottom and a wall which are formed in one body, and facing the display panel;
a cover plate covering the display panel, the display panel being located between the cover plate and the case; and
an adhesive with which the display panel and the case are fixed,
wherein:
the wall has a first side face and a second side face opposite to the first side face;
the first side face is an inside surface of the box shape;
the second side face is an outside surface of the box shape;
the adhesive is in contact with the side surface and the second side face, and has an inside face and an outer face opposite to the inside face, the inside face being in contact with the second side face;
the outer face is not in contact with any frames and housing cases; and
the adhesive is not in contact with the cover plate.

10. The display device according to claim 9, wherein:
the cover plate overlaps the adhesive in a plan view, and has a light shielding member; and
the light shielding member faces the adhesive with a gap.

11. The display device according to claim 9, wherein the case houses a light source and an optical sheet.

12. The display device according to claim 9, wherein:
the display panel includes a substrate and a polarizer; and
the adhesive is in contact with the polarizer and a side surface of the substrate.

13. The display device according to claim 9, further comprising:
a cover member located at an opposite side of the display panel from the case,
wherein the cover member overlaps an entirety of the adhesive in a plan view.

14. A display device comprising:
a display panel with a side surface;
a backlight under the display panel;
a cover plate covering the display panel, the display panel being located between the cover plate and the backlight;
a housing case housing members included in the backlight, and including a bottom and a wall which rises from a peripheral edge of the bottom toward a display panel side; and
an adhesive placed so as to extend over the side surface of the display panel and the wall of the housing case,
wherein:
the adhesive is not in contact with the cover plate;
the cover plate overlaps the adhesive in a plan view, and has a light shielding member, and
the light shielding member faces the adhesive with a gap.

15. The display device according to claim 14, wherein:
the wall has a first side face facing the members and a second side face opposite of the first side face, the first side face being between the members and the second side face;
the adhesive is placed on the side surface of the display panel and the second side face, and has an inside face and an outer face opposite to the inside face, the inside face being in contact with the second side face, and
the outer face is not in contact with any frames and housing cases.

* * * * *